TRANSISTOR WITH DISTRIBUTED RESISTOR BETWEEN EMITTER LEAD AND EMITTER REGION

Filed Jan. 31, 1964 2 Sheets-Sheet 1

INVENTORS
WILLIAM M. WEBSTER &
EDWARD O. JOHNSON

BY W.S. Hill
AGENT

INVENTORS
WILLIAM M. WEBSTER &
EDWARD O. JOHNSON

BY W. S. Hill
AGENT 3,504,239

TRANSISTOR WITH DISTRIBUTED RESISTOR BETWEEN EMITTER LEAD AND EMITTER REGION

Edward O. Johnson and William M. Webster, Princeton, N.J., assignors to RCA Corporation, a corporation of Delaware Filed Jan. 31, 1964, Ser. No. 341,558
Int. Cl. H01l 1/24
U.S. Cl. 317—235 9 Claims This invention relates to improved semiconductor devices and particularly, but not necessarily exclusively, to improved transistors adapted to handle high power at high frequencies.

Figure 1:
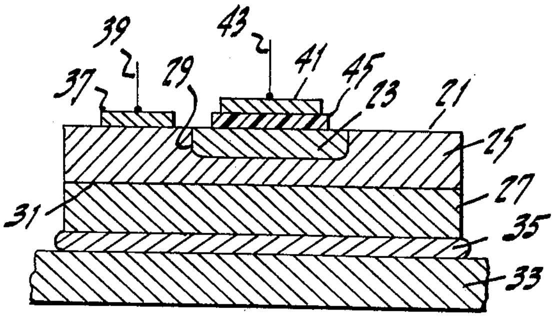

Transistors which are capable of handling high power (more than 1 watt) at high frequencies (more than 100 megacycles) are commercially available. Such transistors are limited in their operating characteristics by second breakdown, a phenomenon in which the emitter current concentrates in local regions and locally overheats the transistor, often destructively. These current concentrations are often called "hot spots" and occur in prior art transistors even though every known precaution is taken to make the emitter and base regions uniform across the current path. Second breakdown reduces the allowable current and voltage ratings of a transistor in many applications and thereby reduces the effective utilization of a transistor of a given geometrical size.

Improvements in operating characteristics have been achieved (1) by increasing the ratio of emitter periphery to emitter area and (2) by spreading and/or dividing the emitter region in order to improve the internal heat dissipating ability of the device. However, these modifications increase the physical size of the transistor, which reduces the number of units that can be made on each ingot slice of semiconductor material, resulting in increased cost per transistor.

An object of this invention is to provide an improved semiconductor device.

Another object is to provide semiconductor devices with improved power and frequency characteristics.

A further object is to provide transistors with improved second breakdown characteristics.

A still further object is to provide transistors with improved power and frequency characteristics, which are economical to manufacture.

In general, a device of the invention comprises a semiconductor body having a base region of one conductivity type adjacent an emitter region of the other conductivity type and defining an emitter p-n junction therebetween. Between the emitter region and a lead or other means or conducting current to the emitter region, is positioned a distributed resistor or other distributed resistive means in such manner that the current density remains substantially equal at high emitter current densities in incremental areas across the emitter junction. The distributed resistive means may be in the form of a thin layer of metal or of semiconductor material having a relatively high sheet resistance.

The distributed resistive means essentially provides a distributed ballast resistor in series with each incremental area of the emitter junction. The ballast resistor limits the current density in the incremental areas of the emitter junction to a value close to that of the other incremental areas. Thus, the current-voltage threshold for second breakdown is increased, for a particular device geometry, thereby imparting to the device a higher power handling capability. Or, alternatively, smaller sized units may be made for a like power rating since essentially all of the emitter areas (not just the periphery) is carrying current to the same degree. Or, alternatively, a combination of increased threshold for second breakdown and smaller units may be provided.

A more detailed description of the feature of the invention, together with illustrative embodiments thereof, are described below in conjunction with the drawings, in which:

FIGURE 1 is a sectional view of a first embodiment of the invention in which the resistive means is in the form of a discrete, epitaxially-grown layer between the emitter region and the emitter contact.

Figure 2:
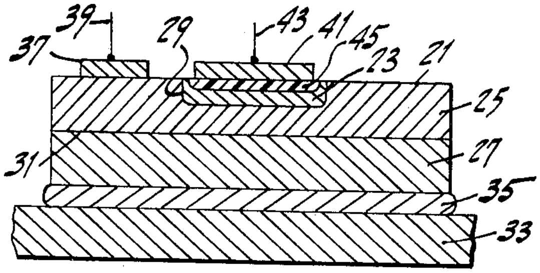
Figure 3:
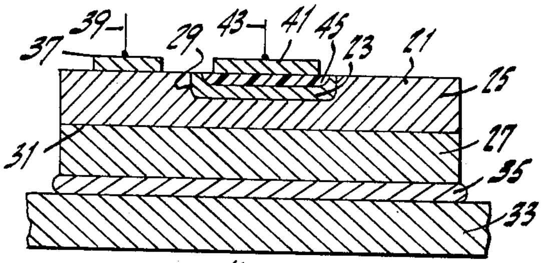
Figure 4:
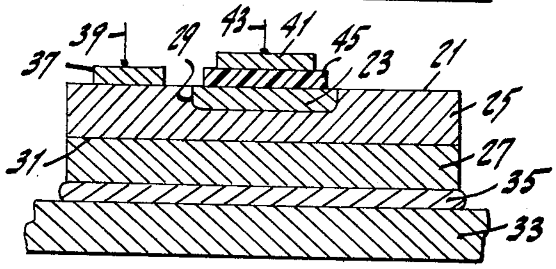
Figure 5:
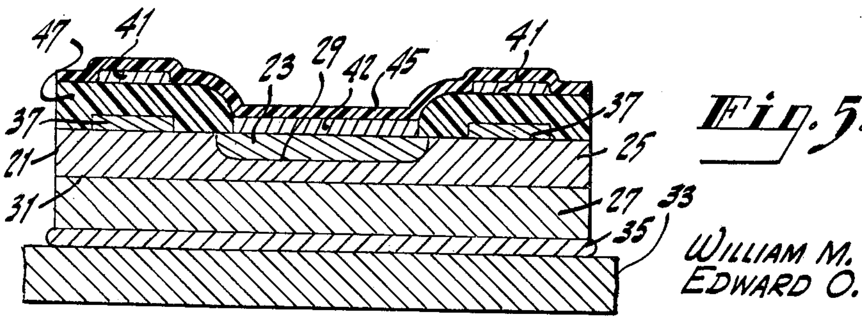
Figure 6A:
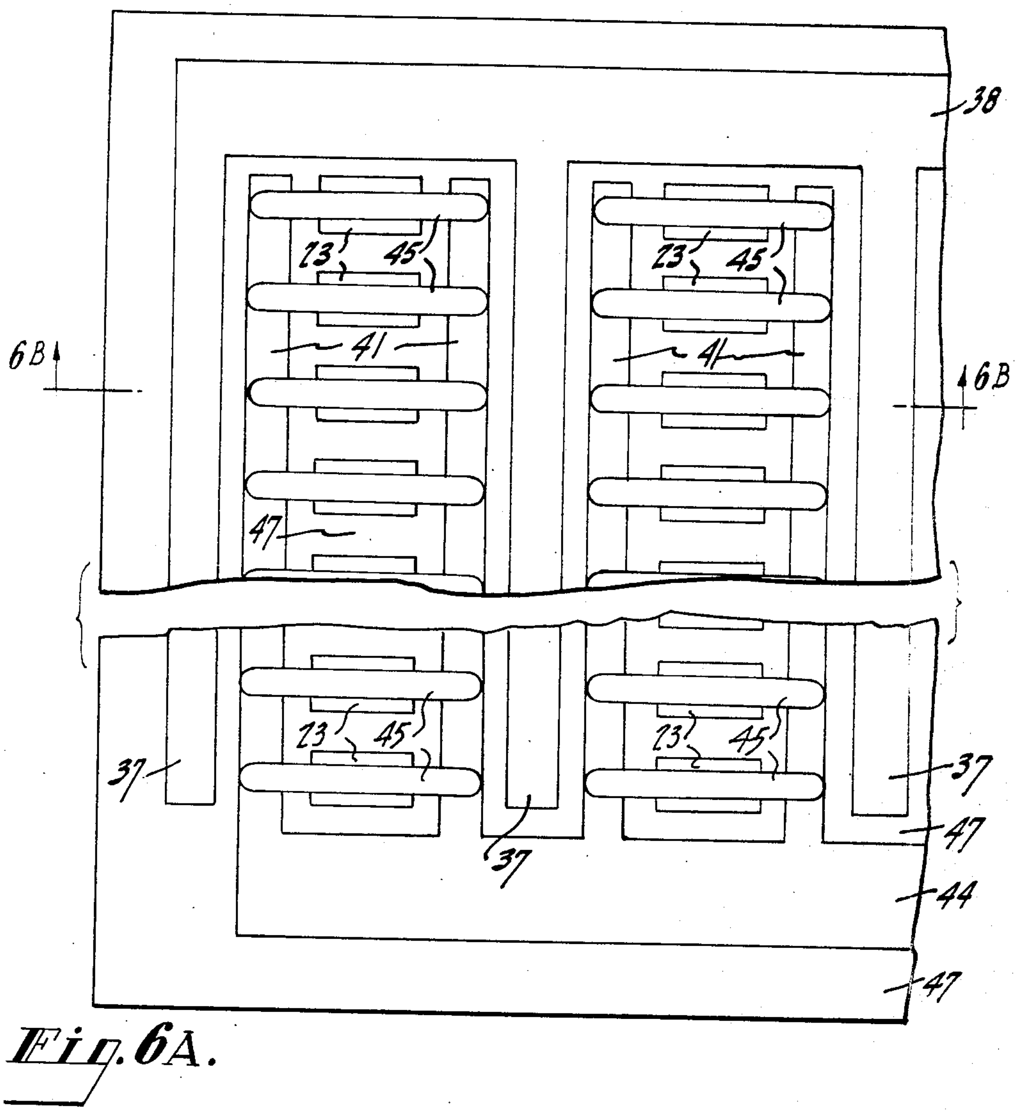
Figure 6B:
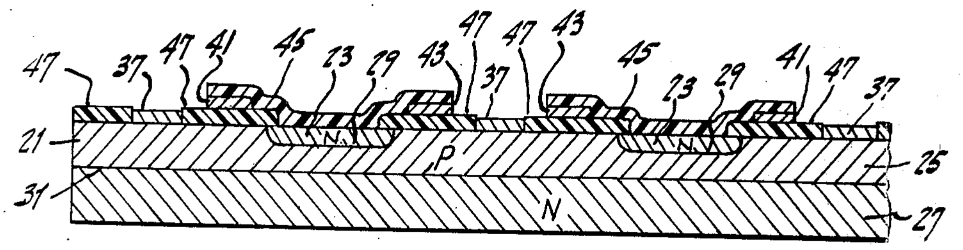

FIGURE 2 is a sectional view of a second embodiment of the invention in which the resistive means is in the form of a resistive skin formed by out-diffusing impurities from a surface layer of the emitter region, FIGURE 3 is a sectional view of a third embodiment of the invention in which the resistive means is in the form of a resistive skin that has been produced by recrystallizing the surface of the emitter region, FIGURE 4 is a sectional view of a fourth embodiment of the invention in which the resistive means is in the form of a discrete vapor-deposited layer between the emitter region and the emitter contact, FIGURE 5 is a sectional view of a fifth embodiment of the invention in which the resistive means is in the form of a discrete vapor-deposited layer between the emitter contact and the emitter bus or lead, and FIGURES 6A and 6B are respectively plan and sectional views of a sixth embodiment of the invention in which the resistive means is in the form of a multiplicity of discrete vapor-deposited layers between a corresponding multiplicity of discrete emitter regions and the emitter contact.

Similar reference numerals are used for similar elements throughout the drawings.

The various embodiments of the invention described below have improved second breakdown characteristics, and each can carry a relatively high current through a p-n junction, compared to prior devices of like sizes. In prior devices, one or a combination of several phenomena tend to concentrate the current in local regions of the junction where, through excessive heating, second breakdown occurs, usually destructively. Such devices may be rectifiers, transistors, or any of the many semiconductor structures having one or more junctions. Improved second breakdown characteristics are especially important for power transistors, which may have one or more emitter junctions and/or one or more collector junctions.

FIGURE 1 illustrates a first embodiment of a transistor of the invention comprising a semiconductor body 21. The body 21 has therein an emitter region 23 of one conductivity type, for example, p type; a base region 25 of the other conductivity type, for example, n type; and a collector region 27 of the one conductivity type, for example, p type. The emitter region 23 and the base region 25 are adjacent one another and define an emitter p-n junction 29 therebetween. The collector region 27 and the base region 25 are adjacent one another and define a collector p-n junction 31 therebetween. The emitter junction 29 and the collector junction 31 are preferably uniform and closely spaced from one another by the base region 25. The transistor may be of the p-n-p type or of the n-p-n type and, in general, may be any of the homojunction or heterojunction structures known in the semiconductor art. The collector region 27 is attached to a support 33 as with solder 35. The support 33 may be an electrically-conducting metal plate and may be the header of the enclosure for the transistor. Both the support 33 and the solder 35 are selected to provide a heat-sink for conducting away heat generated in the transistor, in a manner known in the art. In FIGURE 1, the support 33 functions as the contact to the collector region 27. If desired, a separate collector contact to the collector region 27 may be provided. In that case, the support 33 may be electrically-insulating.

A base contact 37 and a base lead 39 are connected in series to the base region 25 in a manner known in the transistor art. An emitter contact 41 and an emitter lead 43 are connected in series with one another in a manner known in the transistor art. However, unlike prior devices, the emitter contact 41 is spaced from the emitter region 23 by a thin distributed resistive layer 45. As shown in FIGURE 1, the resistive layer 45 is a semiconductor material which has been deposited epitaxially on the surface of the emitter region 23 by processes known in the art.

FIGURE 2 illustrates a transistor which is similar to that of FIGURE 1, except that the resistive layer 45 is produced by out-diffusing some of the conductivity-determining impurities from a surface layer of the emitter region 23. From the nature of the out-diffusion process, the surface skin is integral with the emitter region and the impurity concentration grades into the emitter region 23.

The structure of FIGURE 2 may also be made by leaching some of the conductivity-determining impurities out of a surface layer of the emitter region 23.

FIGURE 3 illustrates a transistor which is similar to that of FIGURE 1, except that the resistive layer 45 is produced by melting a thin surface layer of the emitter region 23 and then allowing the molten material to recrystallize. Normally, when the molten material recrystallizes, the impurities redistribute themselves and the accompanying segregation effect increases the resistivity of the recrystallized layer. If the recrystallized layer is polycrystalline, it exhibits an increased resistivity by virtue of the lower mobilities of carriers in polycrystalline material. A suitable process for recrystallization of a surface layer is described, for example, by W. G. Pfann in U.S. Patent No. 2,739,088. From the nature of the recrystallization process, the resistive surface skin is discrete from the emitter region 23, but the impurity concentration in the skin varies between the emitter region and the surface.

FIGURE 4 illustrates a transistor which is similar to that of FIGURE 1 except that the resistive layer 45 is produced by evaporating and vapor-depositing a resistive material as a layer 45 on top of the emitter region 23. This evaporative and vapor-deposition technique is considered to be desirable where the emitter region 23 is very thin and particularly where the emitter junction 29 is produced by alloying. This evaporation and vapor-deposition technique is also considered desirable where the emitter region 23 is complex in shape, as in an interdigitated structure, or where there is a multiplicity of small discrete emitter areas constituting the effective emitter region in the device. This technique has the advantage that the emitter region 23 is disturbed the least amount and complex shapes may be produced by masking. This technique also has the advantage that the resistive material may be selected from a large number of resistive materials, for example resistive semiconductors, insulators, or resistive metals or alloys.

FIGURES 1 through 4 illustrate several ways in which the distributed resistive layer 45 may be prepared and constituted in each case. The resistivity and thickness of the resistive layer is such that a voltage drop of at least one, and preferably a few $kT/q$ volts is created at a normal operating current density. In the expression $kT/q$, $k$ is Boltzman's constant, T is the absolute temperature of the layer during the operation of the transistor, and $q$ is the electrostatic charge on an electron. For a typical transistor in which the normal operating current density is 1000 amperes/cm.$^2$, a typical value for the resistance of one square centimeter of the layer is $10^{-4}$ ohms. A resistive layer 45 of 0.03 ohm-cm. material about 30 microns thick may be appropriate in this typical transistor, giving a sheet resistance in the resistive layer 45 of about 10 ohms/square. The sheet resistance of the emitter region 23 should be about the same value or higher to prevent excessive lateral current flow in the emitter region.

The thin distributed resistive layer 45 acts as a multiplicity of small ballast resistors which tends to keep the current density through the thickness of the resistive layer 45 substantially equal across its major dimensions. The sheet resistance (resistance in the direction of the major dimensions of the resistive layer 45) should be high enough to prevent any substantial lateral current flow (current flow in the direction of the major dimensions of the resistive layer 45).

The emitter contact 41 need not cover all of the emitter region 23 and there is considerable flexibility in designing the emitter contact 41. Where there is an emitter contact 41 which covers substantially the emitter region 23, as in the transistors illustrated in FIGURES 1 to 4, it is preferred that the resistive layer 45 have a higher sheet resistance and that the emitter region 23 have a sheet resistance of about the same value or higher. Where the emitter contact 41 does not cover a substantial portion of the emitter region, it is preferred that the resistive layer 45 have a lower sheet resistance and that the emitter junction 29 be divided into discrete sub-areas or islands, as in the transistors illustrated in FIGURES 5 and 6A. Dividing the emitter junction 23 effectively increases the sheet resistance across the emitter region 23 and it also increases the emitter perimeter to emitter area ratio, a desirable feature for silicon transistors.

FIGURE 5 illustrates a fifth embodiment of the invention similar in many respect to the transistor illustrated in FIGURE 4. In the transistor illustrated in FIGURE 5, a metal layer 42 is positioned in contact with and between the emitter region 23 and the resistive layer 45. The resistive layer 45 is located between a pair of emitter contacts 41. Thus, the emitter current passes inwardly from the emitter contacts 41 through the resistive layer 45 where it is distributed and passes through the metal layer 42 to the emitter 23. In this embodiment, the metal contact 42 and the emitter region 23 each should have a relatively high sheet resistance to minimize lateral current flow; that is, the conduction of current parallel to the major surfaces of the contact. The metal layer 42 is optional and may be present to provide a non-rectifying or ohmic contact to the emitter region 23.

In FIGURE 5, base contacts 37 are metallized areas which rest on the base region 25. An insulator layer 47 overlays the base contacts 37 and marginal portions of the emitter region 23. The emitter contacts 41 are metallized areas which rest on the surface of the insulator layer 47. A resistive layer 45 of, for example, partially-reduced tin oxide, overlays the metal layer 42, the emitter contacts 41 and the insulator layer 47. The resistive layer 55 has a sheet resistance of about 1 ohm-cm./square. This can be achieved with a layer of partially-reduced tin oxide, about 1 mil thick. Films of resistive metals or other resistive materials can also be used for the layer 45.

The transistor illustrated in FIGURE 5 may be made using conventional fabrication techniques. One technique will now be described for preparing a transistor having finger-like emitter regions 23 interdigitated with finger-like base contacts 37, and having the cross section illustrated in FIGURE 5 through each finger-like emitter region. Start with a wafer of n-type silicon about 45 mils square and 6 mils thick and having a resistivity of about 1 ohm-cm. Mask one major surface of the wafer and then heat the wafer and mask at about 1000° C. for about 25 minutes in an ambient of nitrogen containing a boron compound, such as boron oxide ($B_2O_3$) vapor. A boron-diffused p-type region 25 is formed in a surface region of the wafer separated by a p-n junction 31 from the undiffused n-type region 27, which is to be the collector region 27.

The external surface of the boron-diffused region 25 is etched to remove disturbed portions and then masked, leaving exposed finger-like areas about 4 mils wide and 20 mils long which are connected to one another at one end, and which define the extent of the emitter region 23 in the finished device. The masked wafer is reheated at about 1200° C. for about 5 minutes in a nitrogen atmosphere containing phosphorus pentoxide ($P_2O_5$). Portions of the p type region 25 are converted to n type by the diffusion therein of phosphorus, thereby forming an emitter region 23, and an emitter p-n junction 29 between the emitter region 23 and the base region 25. The mask on the boron-diffused region 25 is removed and the surface is etched to remove disturbed portions. A mask is now applied to the boron-diffused side of the wafer and the base contacts 37 are produced by evaporating aluminum metal thereon to a thickness of about 0.5 mil. Another mask is now substituted and the metal layer 42 is produced by evaporating gold metal thereon to a thickness of about 0.5 micron. The metal layer 42 is relatively thin and has a relatively high sheet resistance, for example 10 ohms/square, to reduce current conduction in the direction of the major surfaces. The metal layer 42 is used to make ohmic contact to the emitter region 23. Where it is not necessary to make ohmic contact, the metal layer 42 may be omitted; for example, as illustrated in FIGURE 6.

Next, the metal layer 42 is masked and the entire surface is coated with an insulator layer 47 and the mask removed. The insulator 47 may be of any convenient insulator material. One suitable material is silicon oxide of the type which is produced by thermal deposition from the vapor of a silicon compound.

Then, the insulator layer 47 and the metal layer 42 are masked and the emitter contacts 41 are produced by evaporating a relatively thick layer of metal, such as aluminum, on the insulator layer 47. The emitter contacts 41 are in the shape of stripes and extend parallel to and along both sides of the emitter region 23. The emitter contact mask is then removed.

Then, the exposed surface of the emitter contacts 41, the metal layers 42, and the insulator layer 47 are coated with a resistive layer 45. The resistive layer 45 may be of a metal or alloy, such as nichrome, or may be of a compound, such as partially-reduced tin oxide. Metals, alloys, and some chemical compounds may be evaporated and condensed in place as a layer monitored to provide the desired thickness. Other chemical compounds may be produced by reaction or decomposition of reagents in the vapor phase and the reaction product deposited in a layer of the desired thickness. As pointed out above, the desired thickness is such that, at the rated current (amperes per cm.) of the device, the current density through the junction is substantially equal across the area of the emitter junction, and the voltage drop between the emitter lead and the emitter region 23 is a few $kT/q$ volts. The finished transistor is then soldered to a header or other support as with solder 35.

FIGURES 6A and 6B illustrate a transistor of the invention comprising a semiconductor wafer 21 having therein an n-type collector region 27, a p-type base region 25, an n-type emitter region 23 divided into a plurality of discrete sub-areas or islands, a corresponding plurality of separate portions of the emitter junction 29, and a single collector junction 31. This portion of the transistor may be produced by a masking and diffusion technique known in the art. In a particular embodiment the wafer is of elemental silicon and is about 225 mils long by about 150 mils wide by about 10 mils thick, and includes 88 separate rectangular islands constituting the emitter region 23. Each island is about 4 mils wide by 8 mils long by about 1 mil thick. The islands of the emitter region 23 are arranged in 8 rows spaced about 26 mils center-to-center, each row having 11 islands spaced about 8 mils center-to-center. The entire upper surface of the wafer 21 is overlayed with an insulating layer 47 of thermally-grown silicon oxide about 8000 A. thick, except for the portions occupied by the base leads 37, the base bus 38 and the emitter region 23. The islands constituting the emitter region 23 are partially overlayed at the edges thereof by the insulating layer 47 so that the emitter junction 29 is covered where it intersects the surface of the wafer 21.

A plurality of base contacts 37 of aluminum metal in the shape of fingers about 4 mils wide and 0.1 mil thick spaces each of the rows. A pair of emitter contacts 41 of aluminum metal in the shape of fingers about 3 mils wide and 0.1 mil thick overlay the insulator layer 47 on opposite sides of each column. As illustrated, each base contact 37 is spaced about 2 mils from one emitter contact 41 in each adjacent row. All of the base contacts 37 are connected together at one end by a wide base bus 38; and all of the emitter contacts 41 are connected together at one end by an emitter bus 44, so that the base contacts 37 and the emitter contacts 41 form an interdigitated structure.

A separate resistive layer 45 about 5 mils wide and about 18 mils long contacts each island of the emitter region 23 and extends over the adjacent insulator layer 47 into contact with the emitter contact 41 on each side of the island. The resistive layer 45 may be a chromium-gold alloy produced by co-evaporation of chromium metal and gold metal to a thickness monitored to provide the desired resistivity. In this embodiment, it is preferred that each resistive layer 45 have a resistivity of about 2 ohms/square, although useful devices may be prepared with resistivities between 0.1 and 10 ohms/square.

Comparative tests were conducted with the transistor illustrated in FIGURES 6A and 6B and with similar transistors wherein the emitter leads were connected directly to the emitter regions 23 (no resistive layer 45). With 100 volts applied to the collector region 27, the directly-connected transistors conducted about 1 to 2 amperes of emitter current at the onset of second breakdown; whereas the transistors of the invention with 1 to 2 ohms/square resistive layers conducted 8 to 10 amperes of emitter current at the onset of second breakdown.

These results are at least ten times better than results obtained on recent commercial power transistors of similar structure. Transistors of the invention (those which include the resistive layer 45) can pass higher emitter currents and handle higher power than corresponding transistors of conventional structure. This is achieved by raising the threshold at which second breakdown occurs. It will be noted that the wafer of the transistor illustrated in FIGURE 6A is about 225 mils by about 180 mils. This size presently limits factory production to about 4 at a time from one "slice" of a silicon ingot of one size used. However, with transistors embodying the invention, but with lower emitter current and power ratings, about those of prior art transistors, the size of each transistor may be reduced and many more transistors may be made at one time on a single ingot slice, with a consequent reduction in cost per transistor.

What is claimed is:

1. In a semiconductor device comprising:

a semiconductive body having a first region of one conductivity type, said first region being immediately adjacent one surface of said body;

a second region of the other conductivity type in said body adjacent said first region;

a first p-n junction between said first and second regions;

a third region of said one conductivity type in said body adjacent said second region;

a second p-n junction between said second and third regions;

a first electrical contact to said first region, a second electrical contact to said second region, and a third electrical contact to said third region; and, the improvement comprising a layer of resistive material between said first region and said first electrical contact, said layer having a sheet resistivity of about 0.1 to 10 ohms per square.

2. A device as in claim 1, wherein said first and second p-n junctions are disposed substantially parallel with one another.

3. A device as in claim 1, wherein said resistive material consists of material selected from the group consisting of semiconductive materials, insulators, and metals.

4. A device as in claim 1, wherein said layer of resistive material is about 0.5 to 30 microns thick.

5. In a transistor comprising:

a semiconductive body having a first region of one conductivity type, said first region being immediately adjacent one surface of said body;

a second region of the other conductivity type in said body immediately adjacent said first region;

a first p-n junction between said first and second regions;

a third region of one said conductivity type in said body adjacent said second region;

a second p-n junction between said second and third regions, said first and second p-n junctions being disposed substantially parallel with respect to one another;

a first electrical contact to said first region, a second electrical contact to said second region, and a third electrical contact to said third region; and, the improvement comprising a layer of resistive semiconductive material between said first region and said first electrical contact, said layer having a sheet resistivity of about 0.1 to 10 ohms per square and being an integral portion of said first region.

6. A transistor as in claim 5, wherein the surface of said resistive layer is co-planar with the surface of said first region.

7. A transistor as in claim 5, wherein said resistive layer is a recrystallized portion of said first region having a higher resistivity than the remainder of said first region.

8. A transistor as in claim 5, wherein the sheet resistance of said first region is at least as much as the sheet resistance of said resistive layer.

9. In a power transistor having a surface, the combination comprising:

a collector region having a first conductivity type;

a base region adjacent said collector region having a conductivity type opposite to said collector region and extending to said surface;

an emitter region within and adjacent said base region having the same conductivity type as said collector region and extending to said surface;

an emitter contact;

an insulating layer covering said surface except a portion of the emitter region which extends to said surface and is adjacent to said base region, whereby a portion of said emitter region extending to the surface is exposed; and, a distributed resistor film formed over said insulating layer electrically connected between said emitter region and said emitter contact, said film being sufficiently distributed over said insulating layer so that hot spot formation is controlled and damage to said transistor is prevented.

References Cited

UNITED STATES PATENTS

| | | | |
|---|---|---|---|
| 2,623,105 | 12/1952 | Shockley et al. | 317—235 |
| 2,792,540 | 5/1957 | Pfann | 317—235 |
| 2,847,583 | 8/1958 | Lin | 307—88.5 |
| 2,862,115 | 11/1958 | Ross. | |
| 2,894,862 | 7/1959 | Mueller | 148—1.5 |
| 2,905,873 | 9/1959 | Ollendorf et al. | 317—235 |
| 2,915,647 | 12/1959 | Ebers et al. | 307—88.5 |
| 2,948,835 | 8/1960 | Runyon | 317—234 |
| 3,009,085 | 11/1961 | Petritz | 317—235 |
| 3,013,955 | 12/1961 | Roberts | 204—15 |
| 3,017,520 | 1/1962 | Maupin | 307—88.5 |
| 3,183,576 | 5/1965 | Dill | 29—25.3 |
| 3,211,971 | 10/1965 | Barson et al. | 317—235 |
| 3,260,900 | 7/1966 | Shombert | 317—235 |
| 3,286,138 | 11/1966 | Shockley | 317—234 |

JOHN W. HUCKERT, Primary Examiner

R. F. POLISSACK, Assistant Examiner

U.S. Cl. X.R.

317—234